(12) United States Patent
Dosho et al.

(10) Patent No.: US 8,258,990 B2
(45) Date of Patent: Sep. 4, 2012

(54) INTEGRATOR, RESONATOR, AND OVERSAMPLING A/D CONVERTER

(75) Inventors: Shiro Dosho, Osaka (JP); Takashi Morie, Osaka (JP); Kazuo Matsukawa, Osaka (JP); Yosuke Mitani, Osaka (JP); Masao Takayama, Hyogo (JP)

(73) Assignee: Panasonic Corporation, Osaka (JP)

( * ) Notice: Subject to any disclaimer, the term of this patent is extended or adjusted under 35 U.S.C. 154(b) by 71 days.

(21) Appl. No.: 12/888,126

(22) Filed: Sep. 22, 2010

(65) Prior Publication Data

US 2011/0050476 A1 Mar. 3, 2011

Related U.S. Application Data

(63) Continuation of application No. PCT/JP2009/001162, filed on Mar. 16, 2009.

(30) Foreign Application Priority Data

Apr. 28, 2008 (JP) ................... 2008-117349

(51) Int. Cl.
*H03M 3/00* (2006.01)
(52) U.S. Cl. .......................... 341/143; 330/10
(58) Field of Classification Search ............ 341/144, 341/150, 136, 140, 143; 330/10, 207
See application file for complete search history.

(56) References Cited

U.S. PATENT DOCUMENTS

| | | | |
|---|---|---|---|
| 4,117,412 A * | 9/1978 | Holman, II | 330/107 |
| 4,156,853 A * | 5/1979 | Peterson | 330/109 |
| 5,392,043 A | 2/1995 | Ribner | |
| 7,750,731 B2 * | 7/2010 | Poulsen et al. | 330/10 |
| 7,957,716 B2 * | 6/2011 | Ganger et al. | 455/323 |
| 2005/0077955 A1 | 4/2005 | Dosho et al. | |
| 2005/0162219 A1 | 7/2005 | Adan | |

FOREIGN PATENT DOCUMENTS

| | | |
|---|---|---|
| EP | 1 345 330 A2 | 9/2003 |
| GB | 868612 | 5/1961 |

(Continued)

OTHER PUBLICATIONS

Richard Schreier et al., "Delta-Sigma Modulators Employing Continuous-Time Circuitry," IEEE Transactions on Circuits and Systems-I: Fundamental Theory and Applications, vol. 43, No. 4, Apr. 1996.

Xuefeng Chen et al., "A 18mW CT ΔΣ Modulator with 25MHz Bandwidth for Next Generation Wireless Applications," IEEE 2007 Custom Integrated Circuits Conference.

(Continued)

*Primary Examiner* — Peguy Jean Pierre
(74) *Attorney, Agent, or Firm* — McDermott Will & Emery LLP

(57) ABSTRACT

An integrator includes an operational amplifier, a first filter connected to an inverting input terminal of the operational amplifier, and a second filter connected between the inverting input terminal and an output terminal of the operational amplifier. The first filter includes n resistive elements connected in series, and (n−1) capacitive elements each having one end connected to an interconnecting node of the resistive elements and the other end connected to ground. The second filter includes n capacitive elements connected in series, and (n−1) resistive elements each having one end connected to an interconnecting node of the capacitive elements and the other end connected to ground.

14 Claims, 10 Drawing Sheets

FOREIGN PATENT DOCUMENTS

| | | |
|---|---|---|
| JP | 6-164416 | 6/1994 |
| JP | 7-162270 | 6/1995 |
| JP | 07-231258 | 8/1995 |
| JP | 2004-304494 | 10/2004 |
| JP | 2005-520455 | 7/2005 |
| JP | 2006-109059 | 4/2006 |
| WO | WO 2006/038637 A1 | 4/2006 |

OTHER PUBLICATIONS

Carla et al. "Development of an ultralow current amplifier for scanning tunneling microscopy." *Rev Sci Instrum.* 75. No. 2 (2004): 497-501.

Extended European Search Report issued in European Patent Application No. 09738590.0, dated Sep. 27, 2011.

* cited by examiner

INTEGRATOR, RESONATOR, AND OVERSAMPLING A/D CONVERTER

CROSS-REFERENCE TO RELATED APPLICATION

This is a continuation of PCT International Application PCT/JP2009/001162 filed on Mar. 16, 2009, which claims priority to Japanese Patent Application No. 2008-117349 filed on Apr. 28, 2008. The disclosures of these applications including the specifications, the drawings, and the claims are hereby incorporated by reference in their entirety.

BACKGROUND

The present disclosure relates to integrators, and specifically to integrators suitable for continuous-time ΔΣ modulators.

Oversampling A/D converters are widely used, for example, for front-ends of communication devices and conversion of audio signals, and are now essential circuit techniques for communication systems and image/audio signal processing circuits. An example of such oversampling A/D converters is a continuous-time delta-sigma A/D converter (CTDS-ADC) including a continuous-time filter.

In general CTDS-ADCs, an input signal passes through n cascaded integrators (a continuous-time filter), and is quantized by a quantizer. A digital output of the quantizer is converted to an analog current signal by n D/A converters. Then, the analog current signal is fed back to the n integrators. In the CTDS-ADCs, an analog circuit portion includes no switches, so that a lower voltage can be possible. Moreover, a pre-filter usually required in using a sampling filter is not necessary in the CTDS-ADCs. Thus, the CTDS-ADCs are suited for applications to communication systems, and thus emphasis has been placed on their applied and development research in recent years.

SUMMARY

To improve the resolution and the SN performance of the CTDS-ADCs, the order of a filter for removing quantization noise has to be increased, so that the number of operational amplifiers which corresponds to the order is required. That is, to improve the performance of the CTDS-ADCs, a large number of operational amplifiers has to be used. However, an increase in the number of operational amplifiers increases circuit size and power consumption, leading to a cause of the bottleneck in performance improvement of system LSIs applied, for example, to mobile communication devices.

An example integrator may include: an operational amplifier; a first filter connected to an inverting input terminal of the operational amplifier; and a second filter connected between the inverting input terminal and an output terminal of the operational amplifier. The first filter includes n resistive elements connected in series, and (n−1) capacitive elements each having one end connected to an interconnecting node of the resistive elements and the other end connected to ground. The second filter includes n capacitive elements connected in series, and (n−1) resistive elements each having one end connected to an interconnecting node of the capacitive elements and the other end connected to ground. Note that n is an integer equal to or larger than 2.

With this configuration, making a predetermined relationship hold true for the element values of the resistive elements and the capacitive elements of the first filter and the resistive elements and the capacitive elements of the second filter cancels terms of s (s is a Laplace operator) to $s^{n-1}$ in the denominator and the numerator of the transfer function of the integrator, so that the transfer function includes only a term of $1/s^n$. That is, it is possible to configure an n-order integrator by one operational amplifier.

The integrator further may include a third filter having at least one of a resistive element and a capacitive element connected to the first filter in parallel. With this configuration, the third filter serves as a feed-forward path between an input of the integrator and the inverting input terminal of the operational amplifier. Thus, it is possible to obtain zero-order, first-order, and second-order integral components at an output of the integrator.

An example resonator can be configured by providing the above integrator with at least one of a Gm element and a resistive element connected between at least one of interconnecting nodes of the resistive elements of the first filter and the output terminal of the operational amplifier.

Moreover, an example oversampling A/D converter may include: the above integrator; a quantizer quantizing an output of the integrator; (n−1) D/A converters each converting a digital output of the quantizer to a current signal, and feeding the current signal back to the interconnecting node of the resistive elements of the first filter; and (n−1) D/A converters each converting the digital output of the quantizer to a current signal, and feeding the current signal back to the interconnecting node of the capacitive elements of the second filter. Alternatively, an oversampling A/D converter according to the present invention includes: the above integrator; a quantizer quantizing an output of the integrator; (n−1) D/A converters each converting a digital output of the quantizer to a current signal, and feeding the current signal back to the interconnecting node of the resistive elements of the first filter; and a D/A converter converting the digital output of the quantizer to a current signal, and feeding the current signal back to the inverting input terminal of the operational amplifier. Alternatively, an oversampling A/D converter according to the present invention includes: the above integrator having the third filter; a quantizer quantizing an output of the integrator; and a D/A converter converting a digital output of the quantizer to a current signal, and feeding the current signal back to an input side of the integrator. These oversampling A/D converters exhibit a higher-order filtering characteristic than the number of the operational amplifiers which the oversampling A/D converters include.

Note that providing the above oversampling A/D converter with at least one of a Gm element and a resistive element connected between at least one of interconnecting nodes of the resistive elements of the first filter and the output terminal of the operational amplifier allows the oversampling A/D converter to exhibit a filtering characteristic having a zero point in the transfer characteristic of quantization noise.

DETAILED DESCRIPTION

Best mode for carrying out the invention will be described below with reference to the drawings.

First Embodiment

Figure 1:
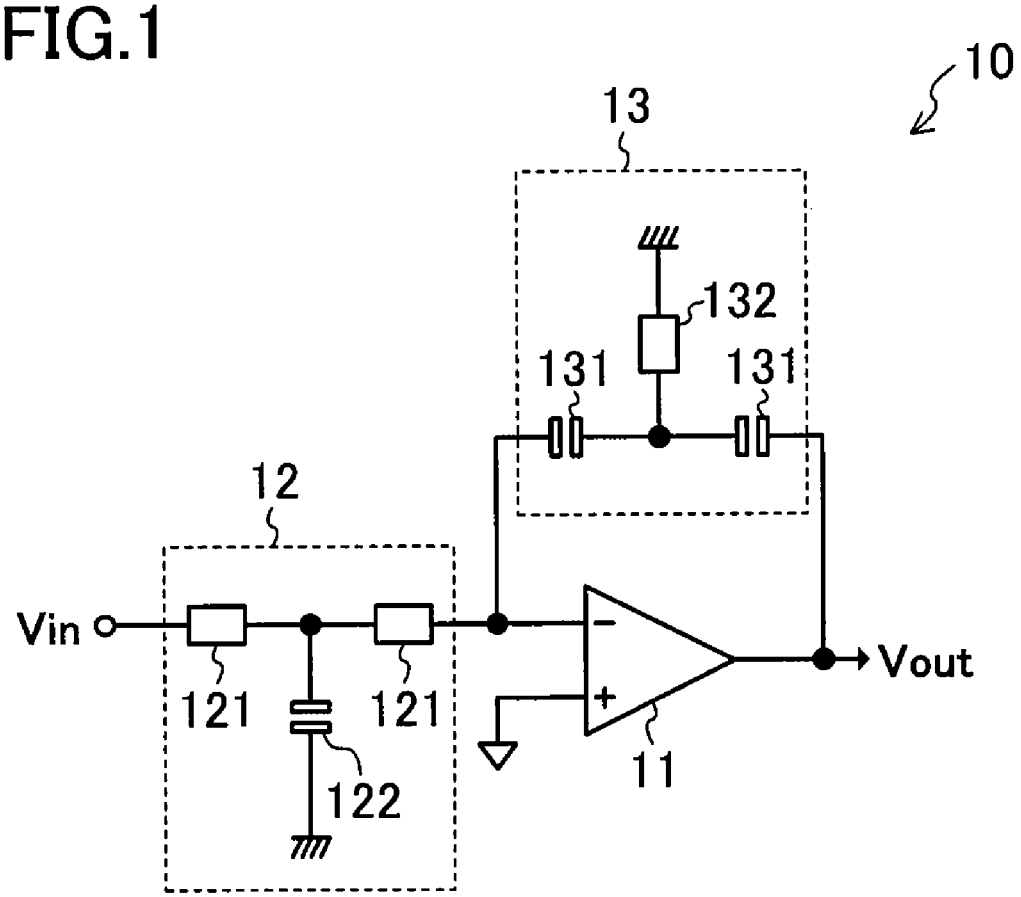
FIG. 1 is a view illustrating a configuration of an integrator according to a first embodiment.

FIG. 1 illustrates a configuration of an integrator according to a first embodiment. The integrator 10 includes an operational amplifier 11, a filter 12 connected to an inverting input terminal of the operational amplifier 11, and a filter 13 connected between the inverting input terminal and an output terminal of the operational amplifier 11. The filter 12 is a second-order lowpass filter including two resistive elements 121 connected in series, and a capacitive element 122 having one end connected to an interconnecting node of the resistive elements, and the other end connected to ground. The filter 13 is a second-order highpass filter including two capacitive elements 131 connected in series, and a resistive element 132 having one end connected to an interconnecting node of the capacitive elements, and the other end connected to ground.

In the integrator 10, provided that the input voltage is $V_{in}$, the output voltage is $V_{out}$, the resistance value of the resistive element 121 is $R_1$, the capacitance value of the capacitive element 122 is $C_1$, the resistance value of the resistive element 132 is $R_2$, the capacitance value of the capacitive element 131 is $C_2$, the voltage at the interconnecting node of the resistive element 121 and the capacitive element 122 is $V_1$, and the voltage at the interconnecting node of the capacitive element 131 and the resistive element 132 is $V_2$, the following nodal equation is derived. Note that s is a Laplace operator.

$$\begin{cases} \dfrac{(V_1 - V_{in})}{R_1} + V_1 \cdot s \cdot C_1 + \dfrac{V_1}{R_1} = 0 \\ -\dfrac{V_1}{R_1} - V_2 \cdot s \cdot C_2 = 0 \\ V_2 \cdot s \cdot C_2 + \dfrac{V_2}{R_2} + (V_2 - V_{out}) \cdot s \cdot C_2 = 0 \end{cases} \quad \text{[Equation 1]}$$

When the nodal equation is solved, the transfer function of the integrator 10 is derived as the following equation.

$$\frac{V_{out}}{V_{in}} = -\frac{1}{s^2 C_2^2 R_1 R_2} \cdot \frac{(2sC_2 R_2 + 1)}{(sC_1 R_1 + 2)} \quad \text{[Equation 2]}$$

Here, when the expression $C_1 R_1 = 4 C_2 R_2$ holds true, the following transfer function is derived.

$$\frac{V_{out}}{V_{in}} = -\frac{1}{2s^2 C_2^2 R_1 R_2} \quad \text{[Equation 3]}$$

That is, it is possible to obtain a transfer function including only a term of $1/s^2$ by appropriately setting the element values of the resistive elements 121 and 132 and the capacitive elements 122 and 131. Thus, according to the present embodiment, a second-order integrator can be configured by one operational amplifier 11. Note that a fourth or higher-order integrator can be configured by multiplexing of the integrator 10 according to the present embodiment. For example, multiplexing of two integrators 10 according to the present embodiment allows configuration of a fourth order integrator by two operational amplifiers 11.

Second Embodiment

Figure 2:
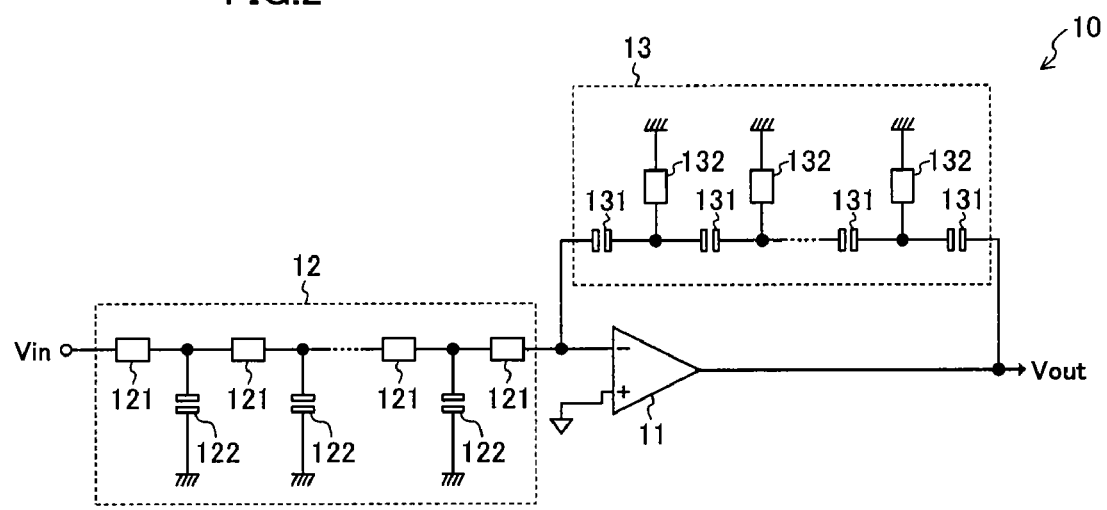
FIG. 2 is a view illustrating a configuration of an integrator according to a second embodiment.

FIG. 2 illustrates a configuration of an integrator according to a second embodiment. The integrator 10 includes filters 12 and 13 whose configurations are different from those of the integrator 10 in FIG. 1. That is, the filter 12 is an n-order lowpass filter including three or more resistive elements 121 connected in series, and capacitive elements 122 each having one end connected to an interconnecting node of the resistive elements and the other end connected to ground. The number of the capacitive elements 122 is smaller than that of the resistive elements 121 by one. The filter 13 is an n-order highpass filter including three or more capacitive elements 131 connected in series, and resistive elements 132 each having one end connected to an interconnecting node of the capacitive elements and the other end connected to ground. The number of the resistive elements 132 is smaller than that of the capacitive elements 131 by one.

Provided that the number of the resistive elements 121 is n, and the number of the capacitive elements 131 is n, the transfer function of the integrator 10 is generally expressed by the following equation. Note that $\alpha$, $\beta$, $\gamma$, $\tau$, and $\kappa$ are constants determined by the element values of the resistive elements 121 and 132 and the capacitive elements 122 and 131.

$$\frac{V_{out}}{V_{in}} = \frac{\prod\limits_{k=1}^{n-1}(\alpha_k + s \cdot \tau_k)}{\gamma \cdot s^n \prod\limits_{k=1}^{n-1}(\beta_k + s \cdot \kappa_k)} \quad \text{[Equation 4]}$$

Here, making a predetermined relationship hold true for the element values of the resistive elements 121 and 132 and the capacitive elements 122 and 131 cancels terms of s to $s^{n-1}$ in the denominator and the numerator of the above transfer function, so that a transfer function including only a term of $1/s^n$ can be obtained. Thus, according to the present embodiment, an n-order integrator can be configured by one operational amplifier.

Note that in the above embodiments, the two resistive elements 121 of the filter 12 may have resistance values different from each other. Moreover, the two capacitive elements 131 of the filter 13 may also have capacitance values different form each other. In any of these cases, making a predetermined relationship hold true for the element values of the resistive elements 121 and 132 and the capacitive elements 122 and 131 makes it possible to configure a second or higher-order integrator 10.

Third Embodiment

Figure 3:
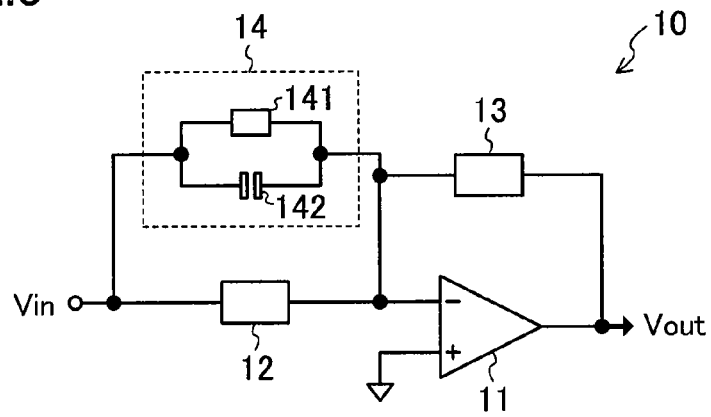
FIG. 3 is a view illustrating a configuration of an integrator according to a third embodiment.

FIG. 3 illustrates a configuration of an integrator according to a third embodiment. The integrator 10 has a configuration in which a filter 14 is added to the integrator 10 of FIG. 1 or 2. The filter 14 includes a resistive element 141 and a capacitive element 142 connected to the filter 12 in parallel. The filter 14 serves as a feed-forward path between an input of the integrator 10 and the inverting input terminal of the operational amplifier 11. Thus, zero-order, first-order, and second-order integral components can be obtained at an output of the integrator 10 in addition to an n-order integral component. The integral component of each order is adjustable by appropriately setting the element values of the resistive element 141 and the capacitive element 142.

Note that the resistive element 141 or capacitive element 142 may be omitted. For example, when the filter 14 includes only the resistive element 141, a first-order integral component can be obtained at the output of the integrator 10 in addition to an n-order integral component. When the filter 14 includes only the capacitive element 142, zero-order and first-order integral components can be obtained at the output of the integrator 10.

Fourth Embodiment

Figure 4:
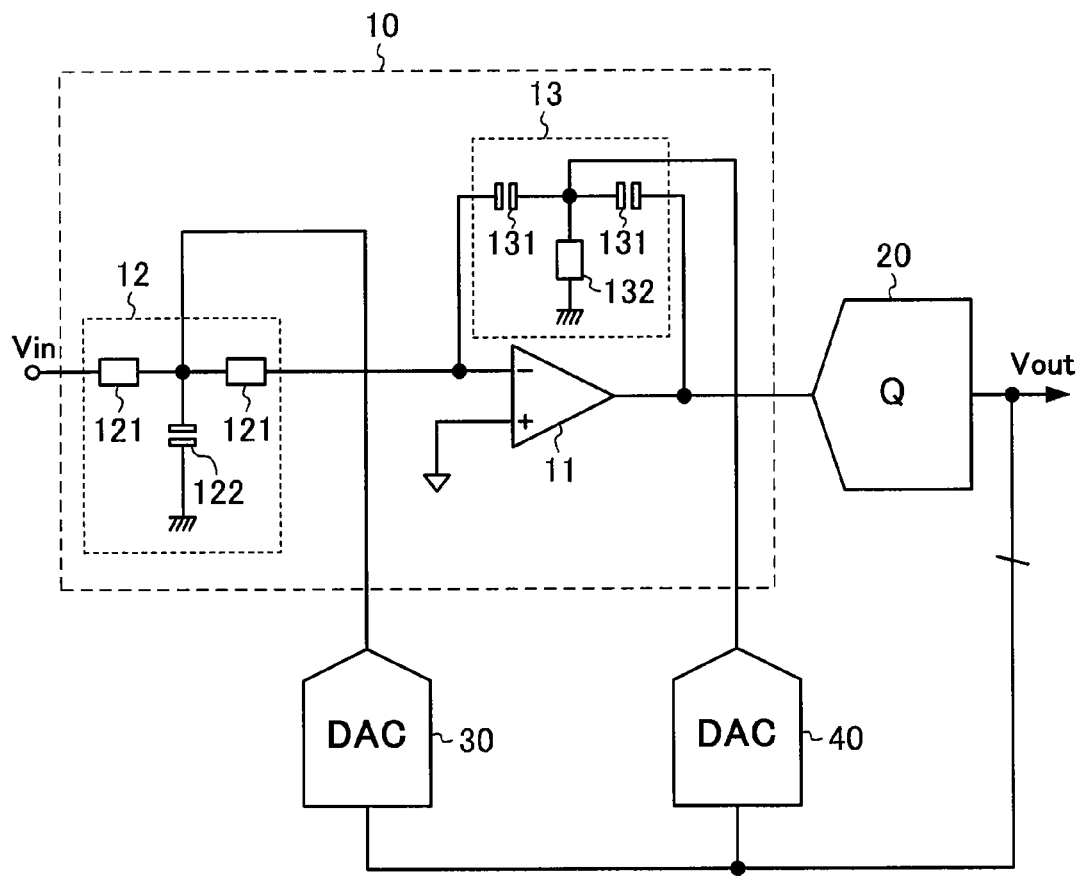
FIG. 4 is a view illustrating a configuration of an oversampling A/D converter according to a fourth embodiment.

FIG. 4 illustrates a configuration of a CTDS-ADC according to a fourth embodiment. In the CTDS-ADC according to the present embodiment, the integrator 10 of FIG. 1 is provided, a quantizer 20 quantizes an output of the integrator 10, a D/A converter 30 converts a digital output of the quantizer 20 to a current signal, and feeds the current signal back to the interconnecting node of the resistive elements 121 of the filter 12, and a D/A converter 40 converts the digital output of the quantizer 20 to a current signal, and feeds the current signal back to the interconnecting node of the capacitive elements 131 of the filter 13. Here, provided that the output current of the D/A converter 30 is $I_1$, and the output current of the D/A converter 40 is $I_2$, the following nodal equation is derived.

$$\begin{cases} -I_1 + \frac{(V_1 - V_{in})}{R_1} + V_1 \cdot s \cdot C_1 + \frac{V_1}{R_1} = 0 \\ -\frac{V_1}{R_1} - V_2 \cdot s \cdot C_2 = 0 \\ -I_2 + V_2 \cdot s \cdot C_2 + \frac{V_2}{R_2} + (V_2 - V_{out}) \cdot s \cdot C_2 = 0 \end{cases} \quad \text{[Equation 5]}$$

When the nodal equation is solved, the relationship between the output voltage $V_{out}$ and the current $I_1$ of the integrator 10 is derived as the following equation.

$$\frac{V_{out}}{I_1} = -\frac{1}{s^2 C_2^2 R_2} \cdot \frac{(2sC_2R_2 + 1)}{(sC_1R_1 + 2)} \quad \text{[Equation 6]}$$

Here, when the expression $C_1R_1 = 4C_2R_2$ holds true, the following equation is derived.

$$\frac{V_{out}}{I_1} = -\frac{1}{2s^2 C_2^2 R_2} \quad \text{[Equation 7]}$$

Moreover, the relationship between the output voltage $V_{out}$ and the current $I_2$ of the integrator 10 is derived as the following equation although its detailed computation process is omitted.

$$\frac{V_{out}}{I_2} = -\frac{1}{sC_2} \quad \text{[Equation 8]}$$

That is, the element values of the resistive elements 121 and 132 and the capacitive elements 122 and 131 are appropriately set to feed an output of the D/A converter 30 back to the interconnecting node of the resistive elements 121 of the filter 12, thereby allowing second-order integral operation. Moreover, an output of the D/A converter 40 is fed back to the interconnecting node of the capacitive elements 131 of the filter 13, thereby allowing first-order integral operation. Thus, according to the present embodiment, an oversampling A/D converter having a second-order filtering characteristic (quantization noise removing property) can be configured by one operational amplifier 11. Note that an oversampling A/D converter which exhibits a fourth or higher-order filtering characteristic can be configured by multiplexing of the integrator 10. For example, multiplexing of two integrators 10 allows configuration of an oversampling A/D converter which exhibits a fourth-order filtering characteristic by two operational amplifiers 11.

Fifth Embodiment

Figure 5:
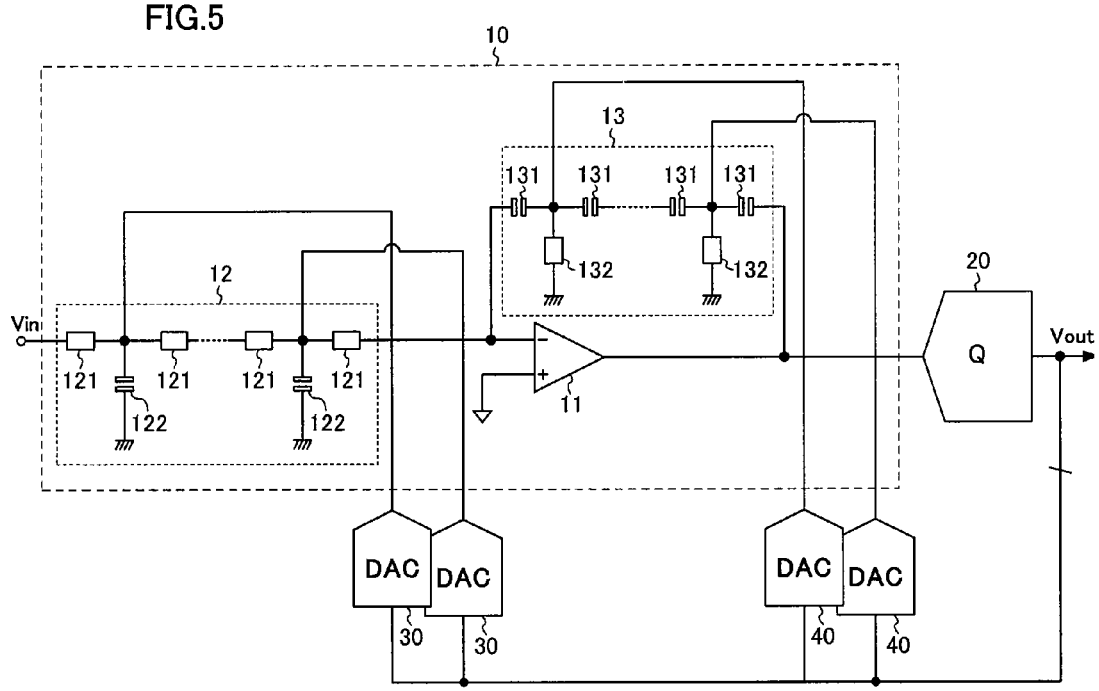
FIG. 5 is a view illustrating a configuration of an oversampling A/D converter according to a fifth embodiment.

FIG. 5 illustrates a configuration of a CTDS-ADC according to a fifth embodiment. In the CTDS-ADC according to the present embodiment, the integrator 10 of FIG. 2 is provided, a quantizer 20 quantizes an output of the integrator 10, a plurality of D/A converters 30 each convert a digital output of the quantizer 20 to a current signal, and feed the current signal back to the interconnecting node of the resistive elements 121 of the filter 12, and a plurality of D/A converters 40 each convert the digital output of the quantizer 20 to a current signal, and feed the current signal back to the interconnecting node of the capacitive elements 131 of the filter 13. As described above, making a predetermined relationship hold true for the element values of the resistive elements 121 and 132 and the capacitive elements 122 and 131 allows the integrator 10 to exhibit an n-order integral characteristic. Thus, according to the present embodiment, an oversampling A/D converter which exhibits an n-order filtering characteristic can be configured by one operational amplifier 11.

Sixth Embodiment

Figure 6:
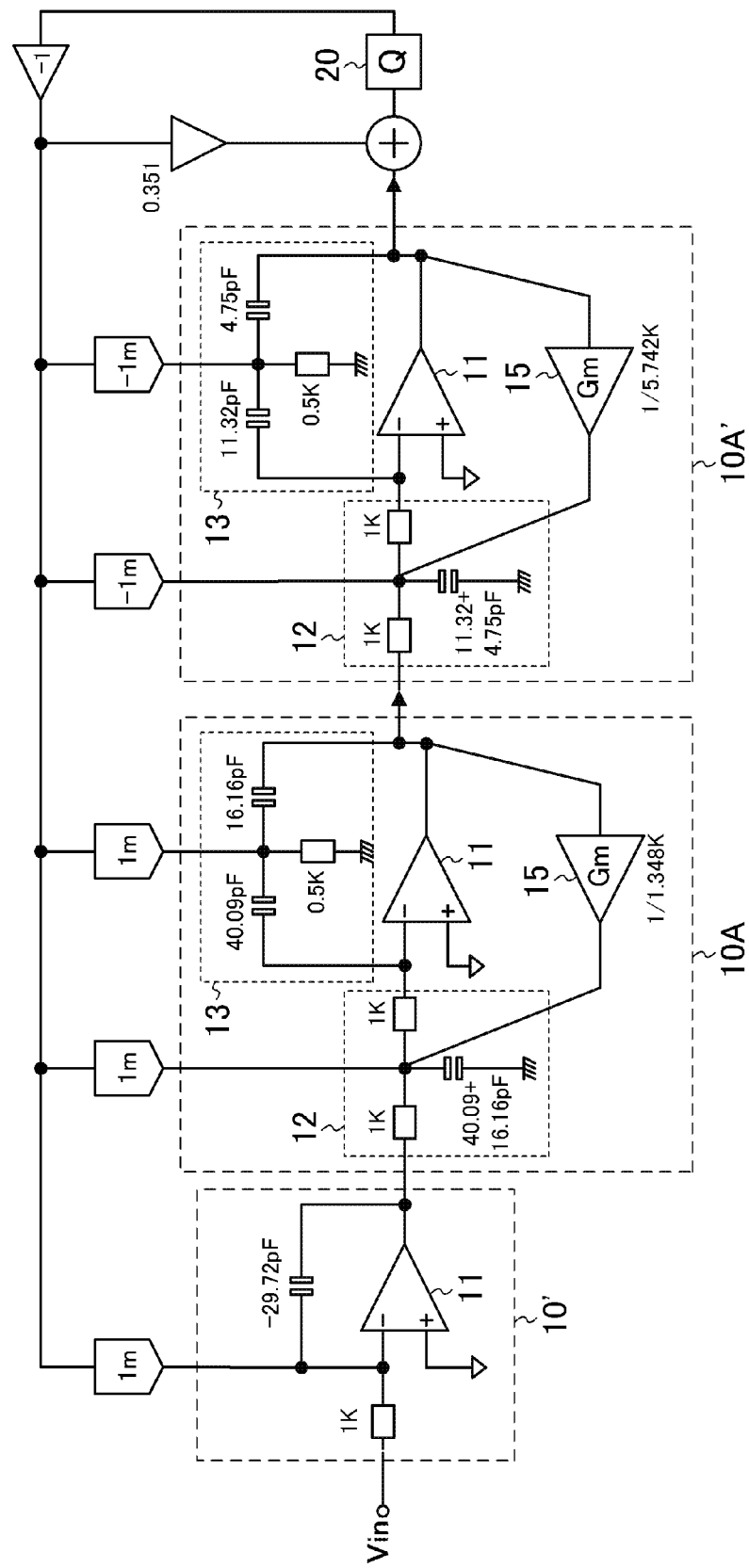
FIG. 6 is a view illustrating a configuration of an oversampling A/D converter according to a sixth embodiment.

FIG. 6 illustrates a configuration of a CTDS-ADC according to a sixth embodiment. The CTDS-ADC according to the present embodiment includes an ordinary first-order integrator 10' and second-order resonators 10A and 10A' to exhibit a fifth-order filtering characteristic as a whole. Note that in FIG. 6, symbols shown near elements represent element values. The resonators 10A and 10A' each has a configuration in which a Gm element (transonductor element) 15 is added to the integrator 10 of FIG. 1. The Gm element 15 feeds an output of the operational amplifier 11 back to the interconnecting node of the resistive elements of the filter 12.

Figure 7:
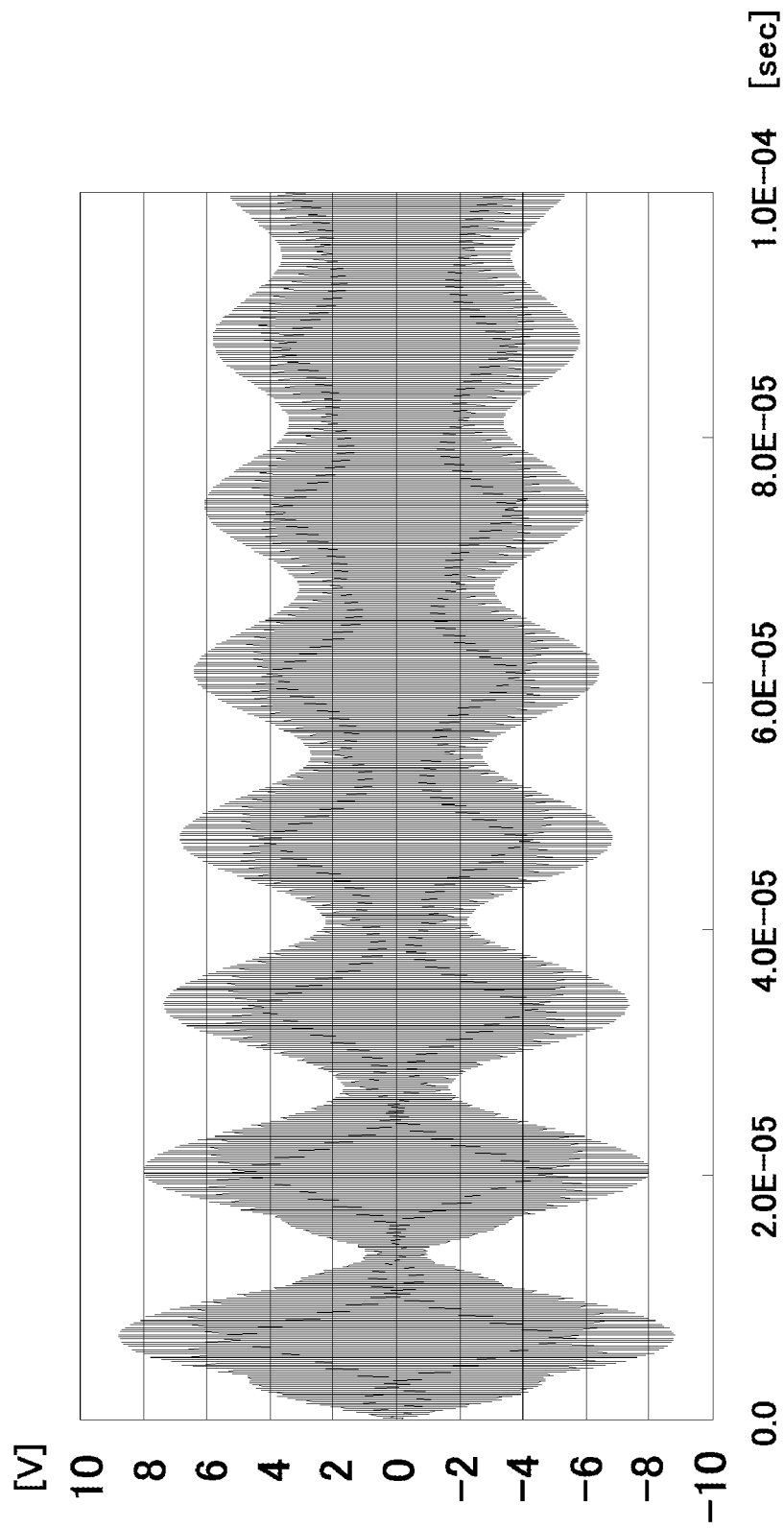
FIG. 7 is a graph illustrating a simulation result of a transient response of a resonator according to the present invention of FIG. 6.

FIG. 7 illustrates a simulation result of a transient response of the resonator 10A of FIG. 6 when a sine wave of 5 MHz around the resonance frequency is input to the resonator 10A. Note that the gain of the operational amplifier 11 is 70 dB, and the GBW of the operational amplifier 11 is 200 MHz. From the simulation result, it can be seen that the resonator 10A does not oscillate.

Seventh Embodiment

Figure 8:
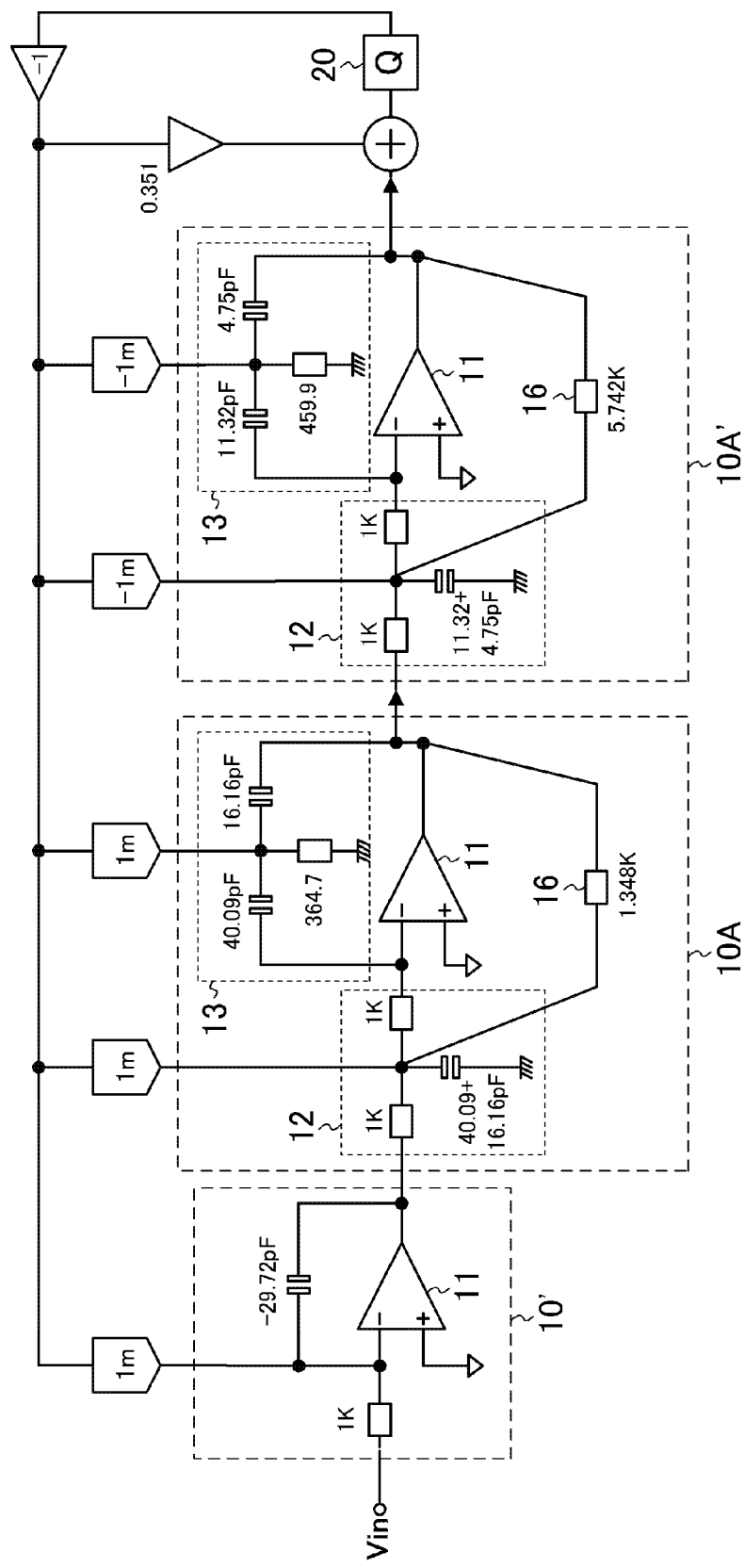
FIG. 8 is a view illustrating a configuration of an oversampling A/D converter according to a seventh embodiment.

FIG. 8 illustrates a configuration of a CTDS-ADC according to a seventh embodiment. The CTDS-ADC according to the present embodiment has a configuration in which the Gm elements 15 in the resonators 10A and 10A' of the CTDS-ADC of FIG. 6 are substituted by resistive elements 16.

Figure 9:
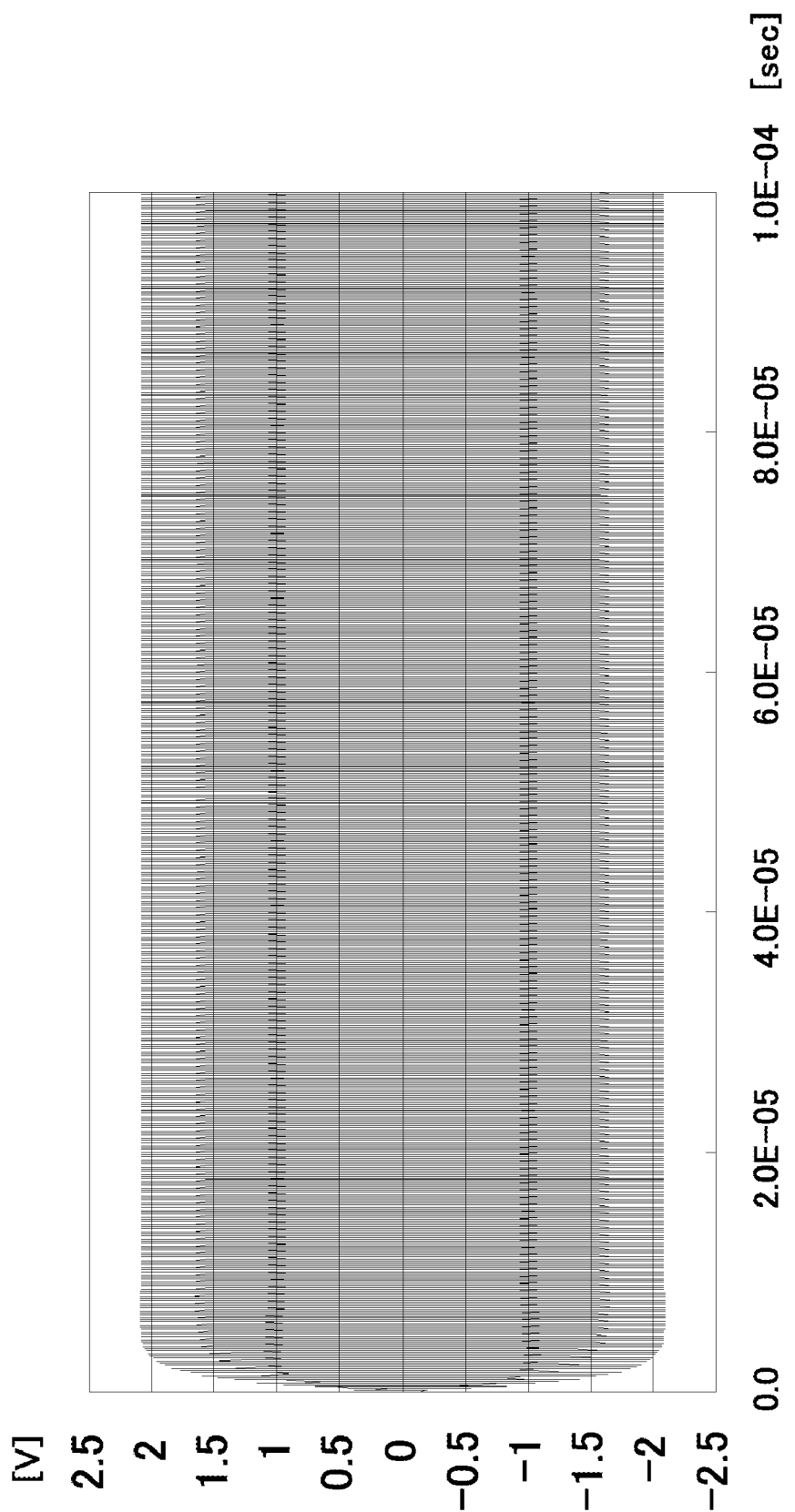
FIG. 9 is a graph illustrating a simulation result of a transient response of a resonator according to the present invention of FIG. 8.

FIG. 9 illustrates a simulation result of a transient response of the resonator 10A of FIG. 8 when a sine wave of 5 MHz around the resonance frequency is input to the resonator 10A. Note that the gain of the operational amplifier 11 is 70 dB, and the GBW of the operational amplifier 11 is 200 MHz. From the simulation result, it can be seen that the resonator 10A does not oscillate. Moreover, when compared with the graph of FIG. 7, it can be seen that the resonator 10A according to the present embodiment has a better transient response characteristic than that of the resonator 10A of the sixth embodiment.

Eighth Embodiment

Figure 10:
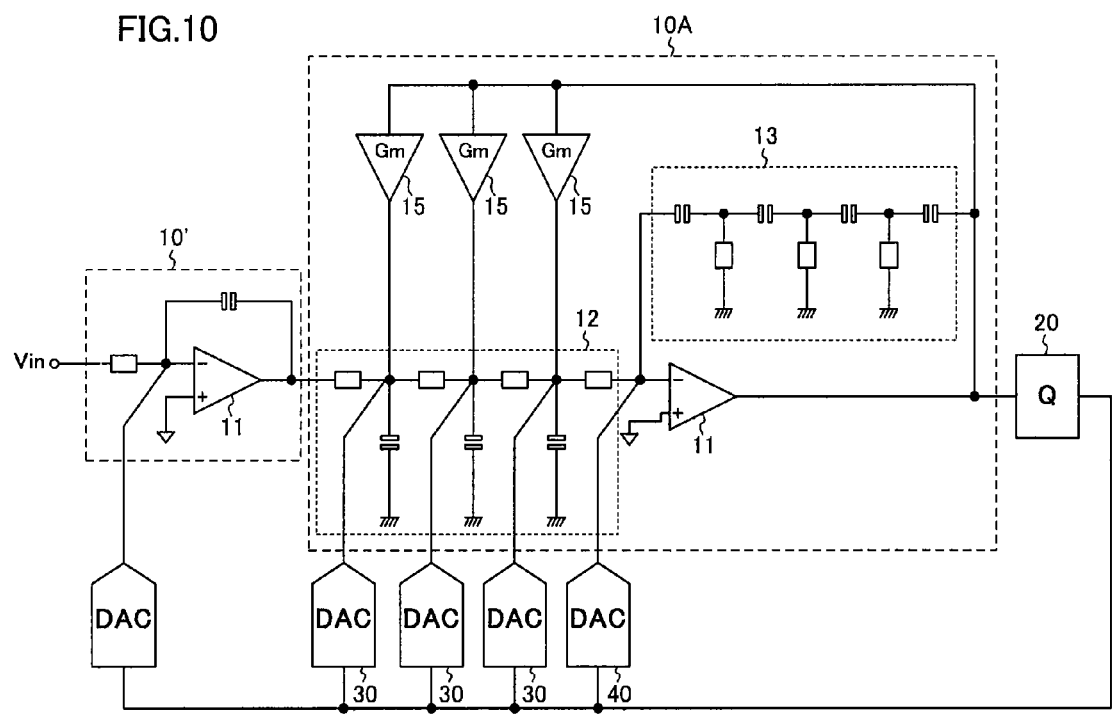
FIG. 10 is a view illustrating a configuration of an oversampling A/D converter according to an eighth embodiment.

FIG. 10 illustrates a configuration of a CTDS-ADC according to an eighth embodiment. The CTDS-ADC according to the present embodiment includes a general first-order integrator 10' and a third-order resonator 10A to exhibit a fourth-order filtering characteristic as a whole.

The resonator 10A has a configuration in which three Gm elements 15 are added to the integrator 10 of FIG. 2. The Gm elements 15 feed an output of the operational amplifier 11 back to the respective interconnecting nodes of the resistive elements of the filter 12. As in the CTDS-ADC of FIG. 5, outputs of three D/A converters 30 are respectively fed back to the interconnecting nodes of the resistive elements of the filter 12. However, in contrast to the CTDS-ADC of FIG. 5, an output of a D/A converter 40 is not fed back to the interconnecting nodes of the capacitive elements of the filter 13 but is fed back to the inverting input terminal of the operational amplifier 11. Thus, according to the present embodiment, the total number of D/A converters is relatively small, which can reduce circuit size and power consumption.

Note that the Gm elements 15 may be substituted by resistive elements. Moreover, it is not necessary to connect the Gm elements 15 or the resistive elements to all the interconnecting nodes of the resistive elements of the filter 12. That is, a resonator can be configured by feeding an output of the operational amplifier 11 back to at least one connecting node of the resistive elements of the filter 12 via a Gm element or a resistive element.

Ninth Embodiment

Figure 11:
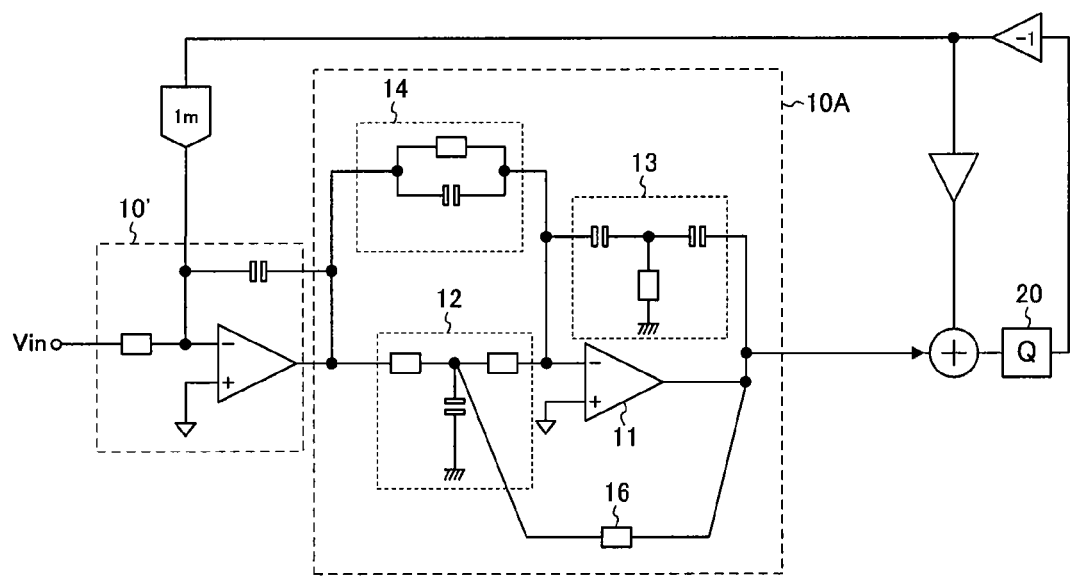
FIG. 11 is a view illustrating a configuration of an oversampling A/D converter according to a ninth embodiment.

FIG. 11 illustrates a configuration of a CTDS-ADC according to a ninth embodiment. The CTDS-ADC according to the present embodiment includes a general first-order integrator 10' and a second-order resonator 10A to exhibit a third-order filtering characteristic as a whole. The resonator 10A has a configuration in which a resistive element 16 is added to the integrator 10 of FIG. 3. The resistive element 16 feeds an output of the operational amplifier 11 back to the interconnecting node of the resistive elements of the filter 12.

In the resonator 10A, the filter 14 serves as a feed-forward path between an input of the resonator 10A and the inverting input terminal of the operational amplifier 11. For this reason, the phase of the CTDS-ADC can be compensated without feeding an output of a quantizer 20 back to the interconnecting node of the resistive elements of the filter 12. Thus, according to the present embodiment, it is possible to further reduce the number of D/A converters, which allows a further reduction in circuit size and power consumption.

Note that the resistive element 16 may be substituted by a Gm element. Alternatively, the resistive element 16 may be omitted. The CTDS-ADC in that case exhibits a filtering characteristic which does not have a zero point in the transfer characteristic of quantization noise.

Moreover, in the above embodiments, each resistive element may be configured by a switched capacitor circuit. Thus, the integrator 10 and the resonators 10A and 10A' can be discrete filters. The discrete filter can determine the transfer function of a circuit according to a capacitance ratio, so that it is possible to improve filtering precision.

What is claimed is:

1. An integrator comprising:
an operational amplifier;
a first filter connected to an inverting input terminal of the operational amplifier; and
a second filter connected between the inverting input terminal and an output terminal of the operational amplifier, wherein
provided that n is an integer equal to or larger than 2,
the first filter includes
n resistive elements connected in series, and
(n−1) capacitive elements each having one end connected to an interconnecting node of the resistive elements and the other end connected to ground, and
the second filter includes
n capacitive elements connected in series, and
(n−1) resistive elements each having one end connected to an interconnecting node of the capacitive elements and the other end connected to ground.

2. The integrator of claim 1, further comprising:
a third filter including at least one of a resistive element and a capacitive element connected to the first filter in parallel.

3. The integrator of claim 2, wherein
the resistive elements are switched capacitor circuits.

4. A resonator comprising:
the integrator of claim 3, and
at least one of a Gm element and a resistive element connected between at least one of the interconnecting nodes of the resistive elements of the first filter and the output terminal of the operational amplifier.

5. A resonator comprising:
the integrator of claim 2, and
at least one of a Gm element and a resistive element connected between at least one of the interconnecting nodes of the resistive elements of the first filter and the output terminal of the operational amplifier.

6. An oversampling A/D converter comprising:
the integrator of claim 2;
a quantizer quantizing an output of the integrator; and
a D/A converter converting a digital output of the quantizer to a current signal, and feeding the current signal back to an input side of the integrator.

7. The oversampling A/D converter of claim 6, further comprising:
   at least one of a Gm element and a resistive element connected between at least one of the interconnecting nodes of the resistive elements of the first filter and the output terminal of the operational amplifier.

8. The integrator of claim 1, wherein
the resistive elements are switched capacitor circuits.

9. A resonator comprising:
   the integrator of claim 8, and
   at least one of a Gm element and a resistive element connected between at least one of the interconnecting nodes of the resistive elements of the first filter and the output terminal of the operational amplifier.

10. A resonator comprising:
    the integrator of claim 1, and
    at least one of a Gm element and a resistive element connected between at least one of the interconnecting nodes of the resistive elements of the first filter and the output terminal of the operational amplifier.

11. An oversampling A/D converter comprising:
    the integrator of claim 1;
    a quantizer quantizing an output of the integrator;
    (n−1) D/A converters each converting a digital output of the quantizer to a current signal, and feeding the current signal back to the interconnecting node of the resistive elements of the first filter; and
    (n−1) D/A converters each converting the digital output of the quantizer to a current signal, and feeding the current signal back to the interconnecting node of the capacitive elements of the second filter.

12. The oversampling A/D converter of claim 11, further comprising:
    at least one of a Gm element and a resistive element connected between at least one of the interconnecting nodes of the resistive elements of the first filter and the output terminal of the operational amplifier.

13. An oversampling A/D converter comprising:
    the integrator of claim 1;
    a quantizer quantizing an output of the integrator;
    (n−1) D/A converters each converting a digital output of the quantizer to a current signal, and feeding the current signal back to the interconnecting node of the resistive elements of the first filter; and
    a D/A converter converting the digital output of the quantizer to a current signal, and feeding the current signal back to the inverting input terminal of the operational amplifier.

14. The oversampling A/D converter of claim 13, further comprising:
    at least one of a Gm element and a resistive element connected between at least one of the interconnecting nodes of the resistive elements of the first filter and the output terminal of the operational amplifier.

* * * * *